United States Patent
Cordero et al.

(10) Patent No.: US 9,087,615 B2
(45) Date of Patent: Jul. 21, 2015

(54) MEMORY MARGIN MANAGEMENT

(71) Applicant: International Business Machines Corporation, Armonk, NY (US)

(72) Inventors: Edgar R. Cordero, Round Rock, TX (US); Timothy J. Dell, Colchester, VT (US); Anil B. Lingambudi, Bangalore (IN); Diyanesh B. Vidyapoornachary, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 13/886,971

(22) Filed: May 3, 2013

(65) Prior Publication Data
US 2014/0328132 A1   Nov. 6, 2014

(51) Int. Cl.
*G11C 29/50* (2006.01)
*G11C 5/04* (2006.01)
*G11C 29/02* (2006.01)

(52) U.S. Cl.
CPC ............ *G11C 29/50012* (2013.01); *G11C 5/04* (2013.01); *G11C 29/023* (2013.01); *G11C 29/028* (2013.01)

(58) Field of Classification Search
CPC ... G06F 13/1689; G06F 13/4243; G11C 7/10; G11C 29/50012; G11C 29/028; G11C 5/04; G11C 29/023
USPC ................ 714/E11.155, 6.13, 702; 711/105, 711/E12.001
See application file for complete search history.

(56) References Cited

U.S. PATENT DOCUMENTS

| 6,289,468 | B1 | 9/2001 | Godfrey |
| 6,351,827 | B1 | 2/2002 | Co et al. |
| 6,522,567 | B2 | 2/2003 | Iwanari |
| 6,912,665 | B2 | 6/2005 | Ellis et al. |
| 7,164,289 | B1* | 1/2007 | Choe et al. ............... 326/40 |
| 7,406,643 | B2 | 7/2008 | Osada et al. |
| 7,830,737 | B2 | 11/2010 | Lamb |
| 7,984,329 | B2* | 7/2011 | Lastras-Montano et al. .......... 714/6.13 |
| 8,020,053 | B2 | 9/2011 | Warnes et al. |
| 2004/0264615 | A1* | 12/2004 | Ho et al. .................. 375/355 |
| 2005/0235232 | A1 | 10/2005 | Papanikolaou et al. |
| 2008/0222460 | A1* | 9/2008 | Kim et al. ................ 714/702 |
| 2009/0063896 | A1* | 3/2009 | Lastras-Montano et al. ..... 714/8 |
| 2009/0322376 | A1* | 12/2009 | Lamb ........................ 326/46 |
| 2010/0005212 | A1 | 1/2010 | Gower et al. |
| 2010/0005281 | A1 | 1/2010 | Buchmann et al. |

(Continued)

OTHER PUBLICATIONS

Gollub et al., "Memory Testing With Selective Use of an Error Correction Code Decoder", U.S. Appl. No. 13/734,334, filed Jan. 4, 2013.

*Primary Examiner* — Son Dinh
*Assistant Examiner* — Jerome Leboeuf
(74) *Attorney, Agent, or Firm* — Richard A. Wilhelm; Robert Williams

(57) ABSTRACT

A method for testing and correcting a memory system is described. The method includes selecting a target memory unit of the memory system having a timing margin in response to a trigger to start a timing margin measurement. The stored data in the target memory unit is moved to a spare memory unit. The memory system performs reads and writes of user data from the spare memory unit while measuring the target memory unit. The timing margins of the target memory unit are measured. The reliability of the measured timing margins of the target memory unit based on a timing margin profile is determined.

20 Claims, 8 Drawing Sheets

(56) References Cited

U.S. PATENT DOCUMENTS

| | | |
|---|---|---|
| 2010/0162037 A1 | 6/2010 | Maule et al. |
| 2010/0180154 A1 | 7/2010 | Bellows |
| 2010/0195426 A1* | 8/2010 | Yamamoto ............... 365/201 |
| 2012/0150912 A1* | 6/2012 | Ripberger ............... 707/786 |
| 2012/0272119 A1 | 10/2012 | Buchmann et al. |
| 2013/0018617 A1* | 1/2013 | Buck et al. ............... 702/81 |

* cited by examiner

US 9,087,615 B2

MEMORY MARGIN MANAGEMENT

FIELD

The present disclosure relates generally to memory testing, and more particularly relates to timing margin degradation measurement and correction in memory systems.

BACKGROUND

Contemporary high performance computing memory systems are generally composed of one or more dynamic random access memory (DRAM) devices, which are connected to one or more processors via one or more memory control elements. Overall computer system performance is affected by each of the key elements of the computer structure, including the performance/structure of the processor(s), and memory cache(s), the input/output (I/O) subsystem(s), the efficiency of the memory control function(s), the main memory device(s), and the type and structure of the memory interconnect interface(s).

SUMMARY

In an embodiment, a method for testing and correcting a memory system is described. The method includes selecting a target memory unit of the memory system having a timing margin in response to a trigger to start a timing margin measurement. The stored data in the target memory unit is moved to a spare memory unit. The memory system performs reads and writes of user data from the spare memory unit while measuring the target memory unit. The timing margins of the target memory unit are measured. The reliability of the measured timing margins of the target memory unit based on a timing margin profile is determined.

In another embodiment, a memory system including a volatile memory unit, firmware, and a memory buffer is described configured to perform the steps of the summarized method above.

BRIEF DESCRIPTION OF THE DRAWINGS

Embodiments are illustrated by way of example, and not by way of limitation, in the figures of the accompanying drawings in which reference numerals refer to similar elements.

DETAILED DESCRIPTION

Figure 1:
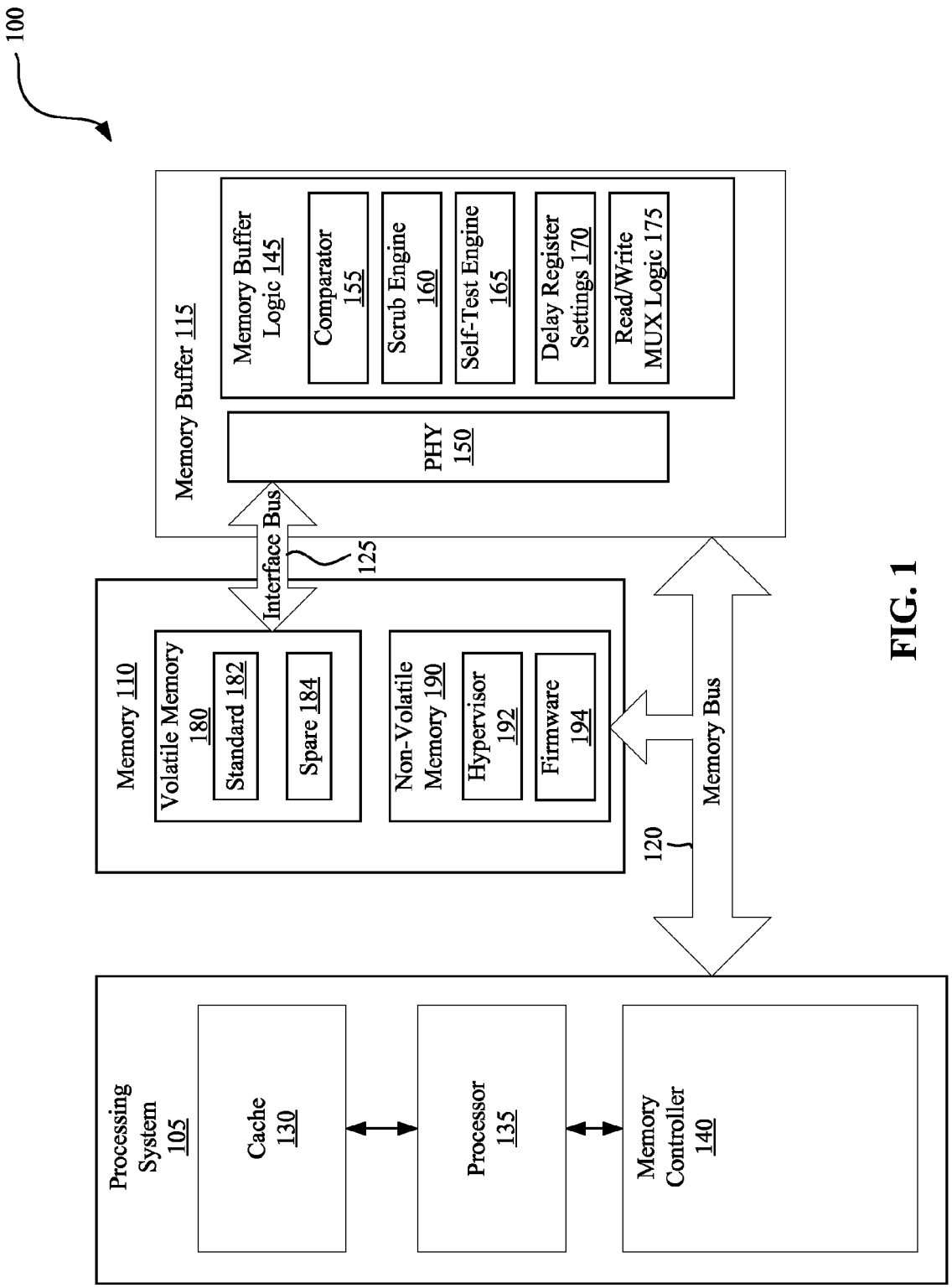
FIG. 1 is a block diagram of a memory system with timing margin degradation measurement and correction capabilities, according to an embodiment.

Embodiments herein provide for a memory system with timing margin testing and correction capabilities and a method of doing the same. Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of the invention as claimed. The same numbers may be used in the Figures and the Detailed Description to refer to the same devices, parts, components, steps, operations, and the like.

In a memory system, on a double data rate (DDR) memory buffer, for example, there are a variety of calibration schemes supported by a memory controller to account for timing, frequency, temperature, aging, and other effects. After the calibration schemes have run, settings may be adjusted due to one of the effects above. Similarly, incorrect timing margins of the memory buffer may develop in the memory system due to similar factors. Incorrect, degraded timing margins may cause an error in the memory system. Timing margins (setup margins and hold margins) may degrade over time requiring them to be improved or strengthened periodically. However, current calibration schemes cannot measure timing margins of the memory buffer without affecting the integrity of the stored data on the memory and locking up a memory bus for timing margin measurements. Therefore the system mainline traffic cannot be interleaved.

Embodiments herein provide for a method and apparatus for measuring timing margins on memory units, quantifying degradations of the timing margins, validating delay register settings established by calibration protocols, and if needed, strengthening the delay register settings. Memory buffer logic modules may be implemented in the memory buffer to support routing user data to target and spare memory units. The memory buffer logic may also allow measuring, validating, and adjusting the timing margins in the presence of system mainline traffic, therefore allowing a computer system using the memory system to stay "online" during the timing margin measurement.

Referring to the drawings, FIG. 1 is an exemplary implementation of a memory system 100 of a computer system that is operable to perform timing margin measurements, according to an embodiment. In FIG. 1, the memory system 100 may include a processing system 105, a memory 110, and a memory buffer 115 coupled to each other by a memory bus 120 and an interface bus 125, as illustrated. The processing system 105 may include one or more levels of cache 130, one or more processors 135, and one or more memory controllers 140. In other embodiments, the memory controller 140 may be a part of the memory buffer 115. The memory controller 140 may have a very wide, high bandwidth connection to one or more processing cores of the processor 135 and cache memory 130. This may enable the memory controller 140 to monitor both actual and predicted future data requests to be directed to the memory 110 attached to the memory controller 140. Based on the current and predicted processor 135 and cache 130 activities, the memory controller 140 may determine a sequence of commands to best utilize the attached memory resources to service the demands of the processor 135 and the cache 130. The sequence of commands may be mixed together with user data that is written to the memory 110 in units called "frames". The memory buffer 115 may interpret the frames as formatted by the memory controller 140 and translate the contents of the frames into a format compatible with the memory 110 in which it is destined.

In an exemplary embodiment, the memory buffer 115 may include one or more components of memory buffer logic 145 and one or more physical links (PHY) 150. The memory buffer logic 145 may include, but is not limited to, a comparator 155, a scrub engine 160, a self-test engine 165, a delay register settings 170, and a read/write multiplexor (MUX) logic 175. The self-test engine 165 may be used to test targeted memory locations. In an embodiment, the self-test engine 165 may be referred to as a memory controller built-in self test engine (MCBIST). The self-test engine 165 may provide the capability to read/write different types of data patterns to specified memory locations (including, in the exemplary embodiment, memory locations within spare memory 184 devices) for the purpose of detecting memory device faults that are common in memory systems. The self-test engine 165 may also be used to perform timing measurements with desired data patterns of the memory device being tested. For example, the self-test engine may determine an upper delay margin and a lower delay margin and/or detect that a difference between the upper delay margin and the lower delay margin is below a threshold.

The delay register settings 170 may include the timing margin data such as the upper delay margin and the lower delay margin. The delay register settings 170 may be adjusted if the timing margins change after performing the timing margin measurements.

The scrub engine 160 may be logic to cleanup memory units and spare memory units of the memory system. The cleanup may allow for the memory unit being tested to receive good data. Also, the comparator 155 may be used to compare current timing margin measurements to a timing margin profile measurement, which may be a golden timing margin measurement (timing margin that is acceptable for all or most memory units) or timing margin measurement performed during the manufacture of the memory unit to evaluate the degradation of the timing margins in later tests. The read/write MUX logic 175 may be used to select a target memory unit and spare memory unit addresses for reading and writing data.

In an embodiment, the memory 110 may include a volatile memory 180 and non-volatile memory 190. Many types of volatile memory are possible in the example. The memory 110 may be arranged in elements, such as integrated circuits. The IC chips may be further arranged on a printed circuit board and called a memory module. In applying this structure, an example of volatile memory is random access memory (RAM). An example of RAM is dynamic random access memory (DRAM). The DRAMs may be IC chips, and a collection of DRAMs is a memory module that may be on a printed circuit board such as an in-line memory module. One example of a memory module is a dual in-line memory module (DIMM). A DIMM may include a series of DRAMs. DIMMs may be used with computing platforms. The DIMMS may be designed with a 64 bit data path and 8 bit error correcting code (ECC), which can be optional on the DIMMs. The DIMMs are logically organized and accessed in terms of ranks.

A rank may include a set of dynamic random-access memory (DRAM) chips including a DRAM and one or more optional error correction code (ECC) modules. Each of the DRAMs may have a different width (e.g., 8-bit, 4-bit, etc.). A rank may have different numbers of DRAMs and ECC modules (e.g., 9 DRAMS and 1 ECC module, 16 DRAMs and 2 ECC modules, etc.). Each of the DRAMs may have a plurality of memory locations. The memory location may be of various sizes (e.g., a byte, a word, etc.). The DRAMs of a rank, may be accessed simultaneously. A single dual in-line memory module (DIMM) may include one or more ranks (e.g., 1, 2, 4, 8, etc.).

The volatile memory 180 may include standard memory units 182 and spare memory units 184. In an embodiment, the volatile memory may be DIMMs with one or more ranks of DRAM which may be the standard memory units 182. Each rank may include an additional DRAM that is treated as the spare memory unit 184. In another embodiment, the DIMM may include a spare rank of DRAM that may be treated as the spare memory unit 184 of the memory system 100. In another embodiment, the DRAM may be in a three-dimensional structure having a plurality of die. One of the die may a spare memory unit 184 while the other die of the DRAM are standard memory units 182.

The non-volatile memory 190 may include a hypervisor 192 and other firmware 194. The hypervisor 192 may be used to allocate and manage computer system resources such as memory system 100 resources of the volatile memory 180. The firmware 194 may be used to issue commands to the memory buffer 115 to direct the memory buffer logic 145.

Figure 2:
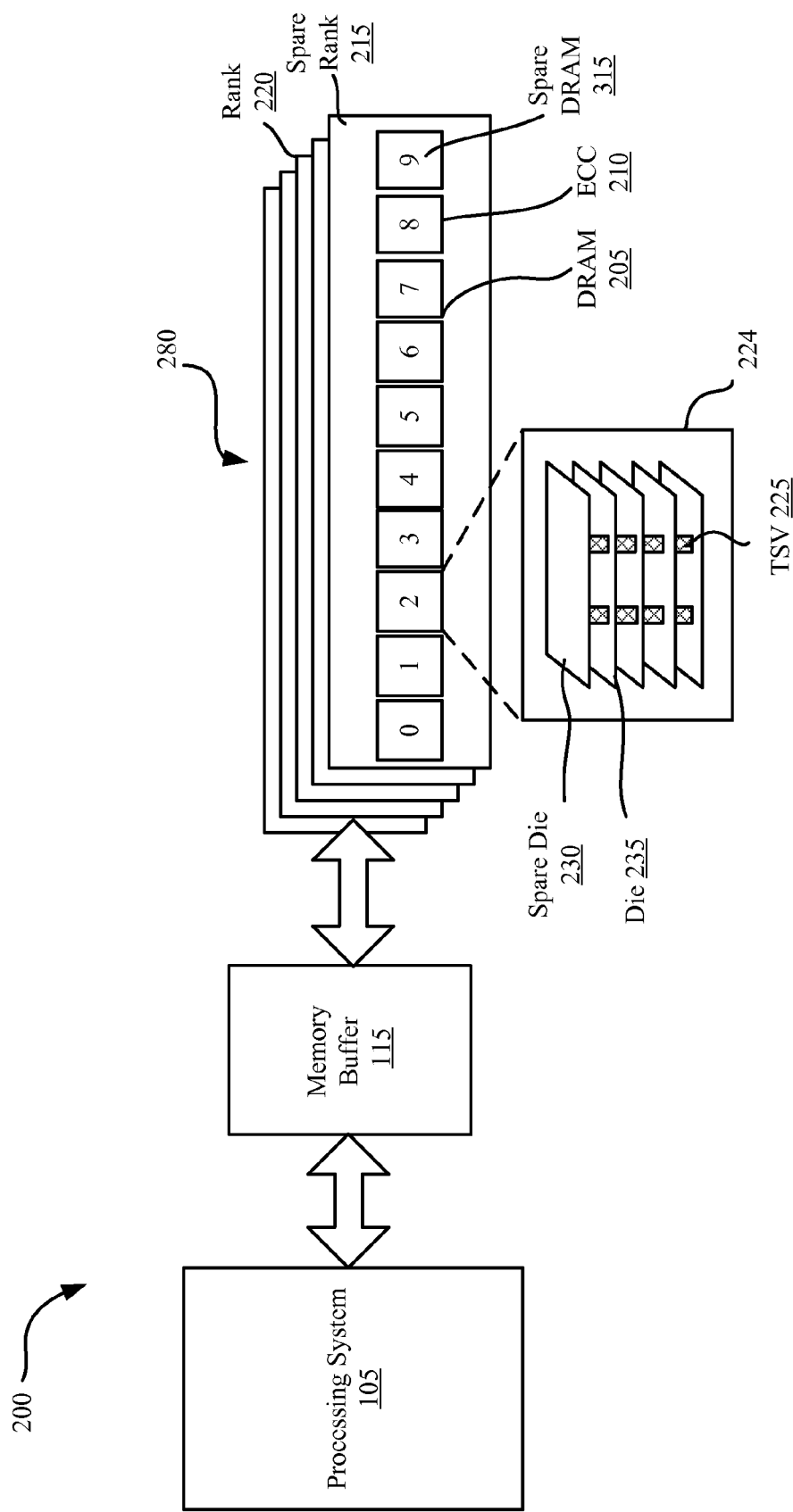
FIG. 2 is a block diagram of the memory system having a spare rank of dynamic random access memory (DRAM), according to an embodiment.

FIG. 2 illustrates a block diagram of an exemplary memory system 200 where a spare rank 215 may be implemented as the spare memory unit 184, according to an embodiment. The processing system 105 and memory buffer 115 may couple with a volatile memory 280. The volatile memory 280 may include a DIMM having one or more ranks 220. Each rank 220 may have one or more DRAMs 205 and one or more optional error correction code (ECC) 210. FIG. 2 illustrates, for example, four standard ranks 220 and one spare rank 215. Each rank may have eight DRAMs 205 and one ECC 210. In one embodiment, each rank may have a spare DRAM 315.

In an embodiment, illustrated in FIG. 2, a spare die 230 may be used similar to a spare rank 220 in the methods below. The spare die 230 may be in a three-dimensional through-silicon-via (TSV) DRAM used in DIMMs. A DRAM package 224 may include the spare die 230 and one or more additional die 235. The spare die 230 and die 235 may be in communication with each other through one ore more TSVs 225. Each of the spare die 230 may make up the spare rank 215, in an embodiment.

Figure 3:
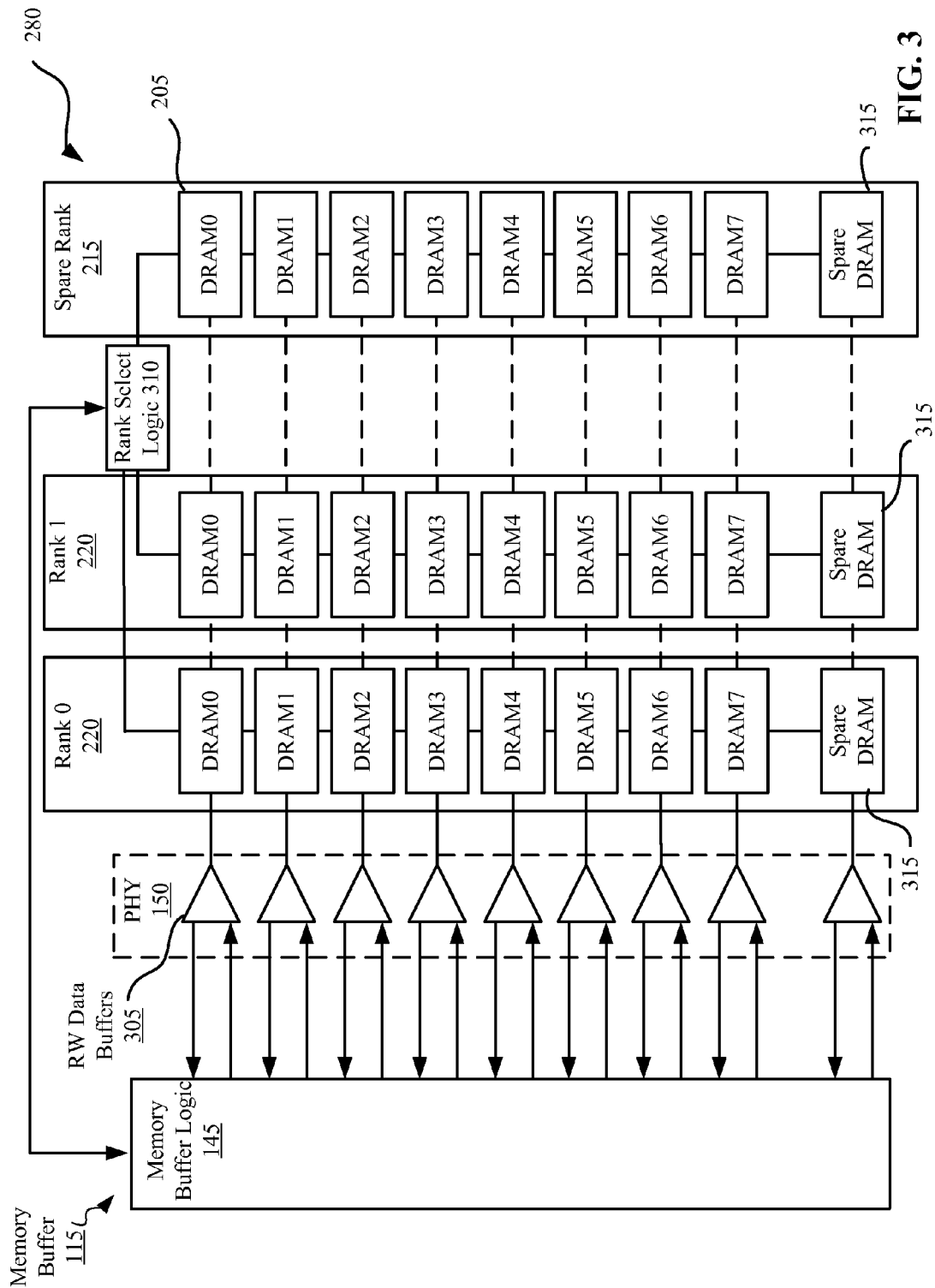
FIG. 3 is a block diagram in greater detail of a memory buffer and DRAM ranks of FIG. 2, according to an embodiment.

FIG. 3 illustrates the volatile memory 280 and the memory buffer 115 of FIG. 2 in greater detail for a rank-wise timing margin measurement, according to an embodiment. The PHY 150 may include a read write (RW) data buffer 305 for each DRAM of a rank 220 and spare rank 215. The RW data buffers 305 may include circuitry to buffer read and write data, directing data to and/or from PHY 150. The memory buffer 115 for rank-wise timing margin measurements may also include additional memory buffer logic 145. The memory buffer logic 145 may include rank select logic 310. The rank select logic 310 may select the rank 220 or spare rank 215 in which the memory buffer 115 is reading and writing. The memory buffer 115 for rank-wise timing margin measurements may also include memory buffer logic 145 such as the RW MUX logic 175 (FIG. 1) for directing data to and from the DRAM 205 of the ranks 220 and spare rank 115. The ranks may include a spare DRAM 315 as well.

Figure 4:
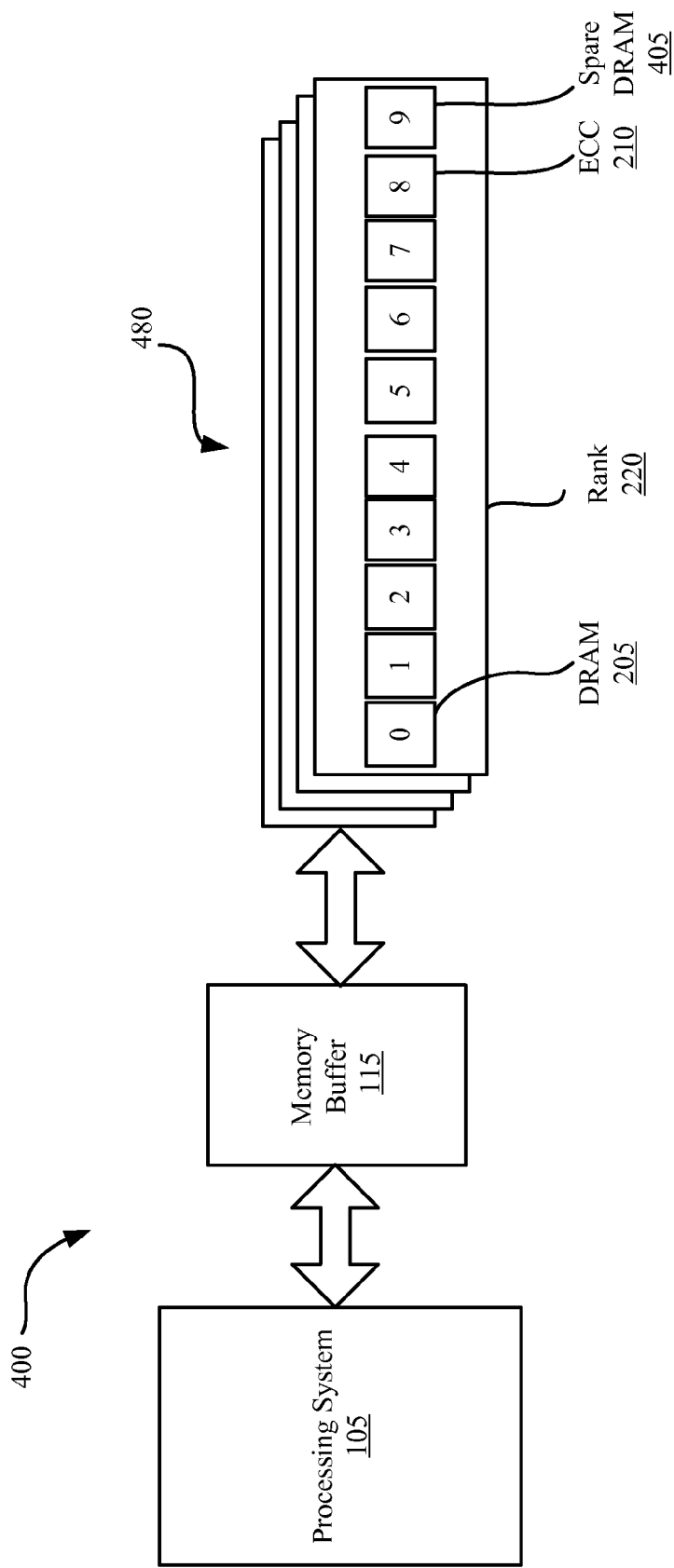
FIG. 4 is a block diagram of the memory system having spare DRAMs on each rank of memory, according to an alternative embodiment.

FIG. 4 illustrates an example block diagram of a memory subsystem 400 where a spare DRAM 405 is implemented on a rank 220 as the spare memory unit 184, according to an embodiment. The processing system 105 and memory buffer 115 may coupled with a volatile memory 480. The volatile memory 480 may include a DIMM having one or more ranks 220. Each rank 220 may have one or more DRAMs 205 and one or more optional error correction code (ECC) 210. Each rank 220 of the DIMM may have a spare DRAM 405. FIG. 4 illustrates, for example, four standard ranks 220. Each rank may have eight DRAMs 205, one ECC 210, and one spare DRAM, for example.

Figure 5:
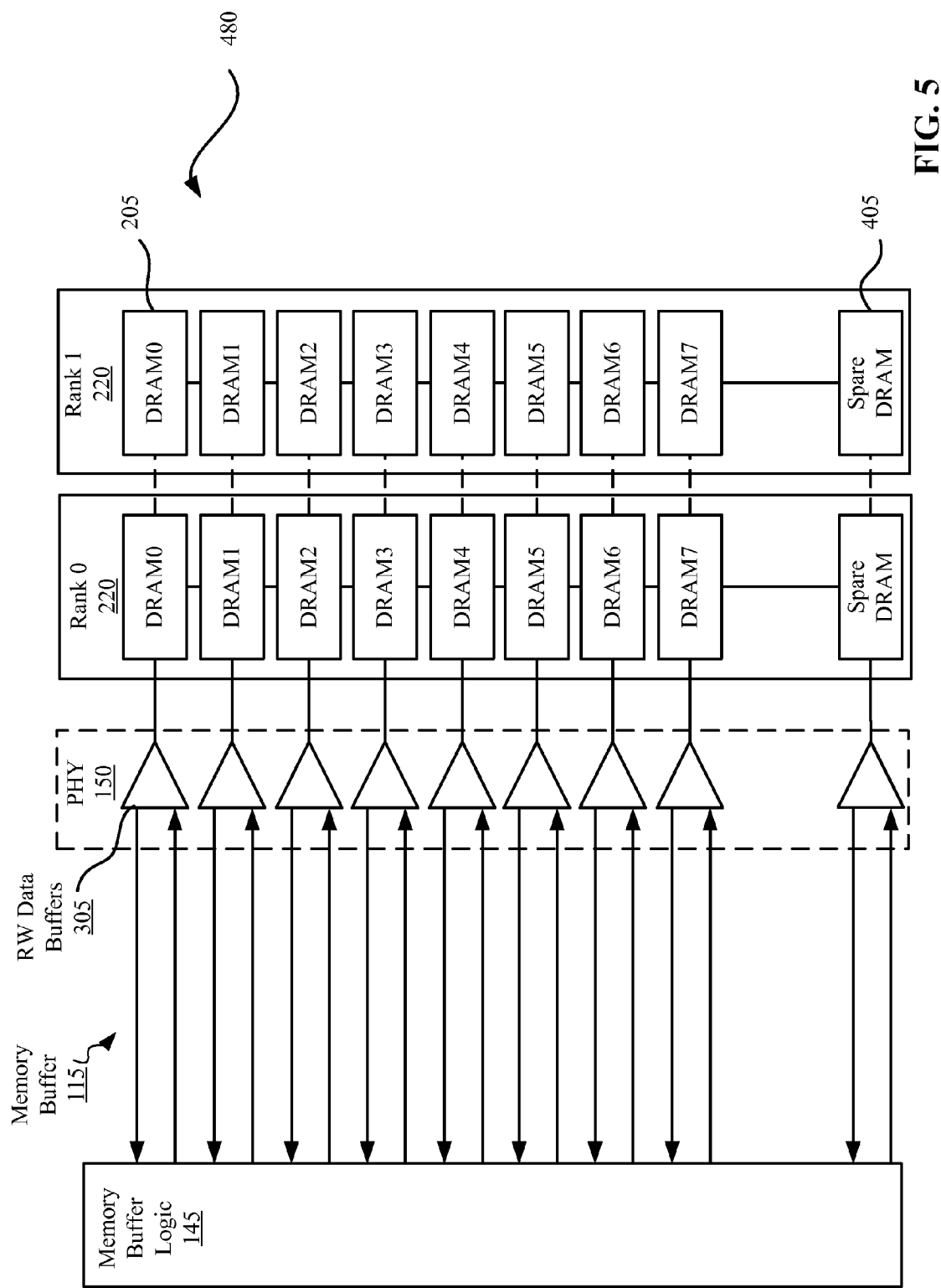
FIG. 5 is a block diagram in greater detail of the memory buffer and ranks having a spare DRAM of FIG. 4, according to an embodiment.

FIG. 5 illustrates the volatile memory 480 and the memory buffer 115 of FIG. 4 in greater detail, according to an embodiment. The PHY 150 may include a read write (RW) data buffer 305 for each DRAM 205 and spare DRAM 405 of a rank 220. The RW data buffers 305 may include circuitry to buffer read and write data, directing data to and/or from PHY 150. The memory buffer 115 for byte-wise timing margin measurements may also include memory buffer logic 145 such as the RW MUX logic 175 (FIG. 1) for directing data into the DRAMs 205 and spare DRAMS 405.

Figure 6:
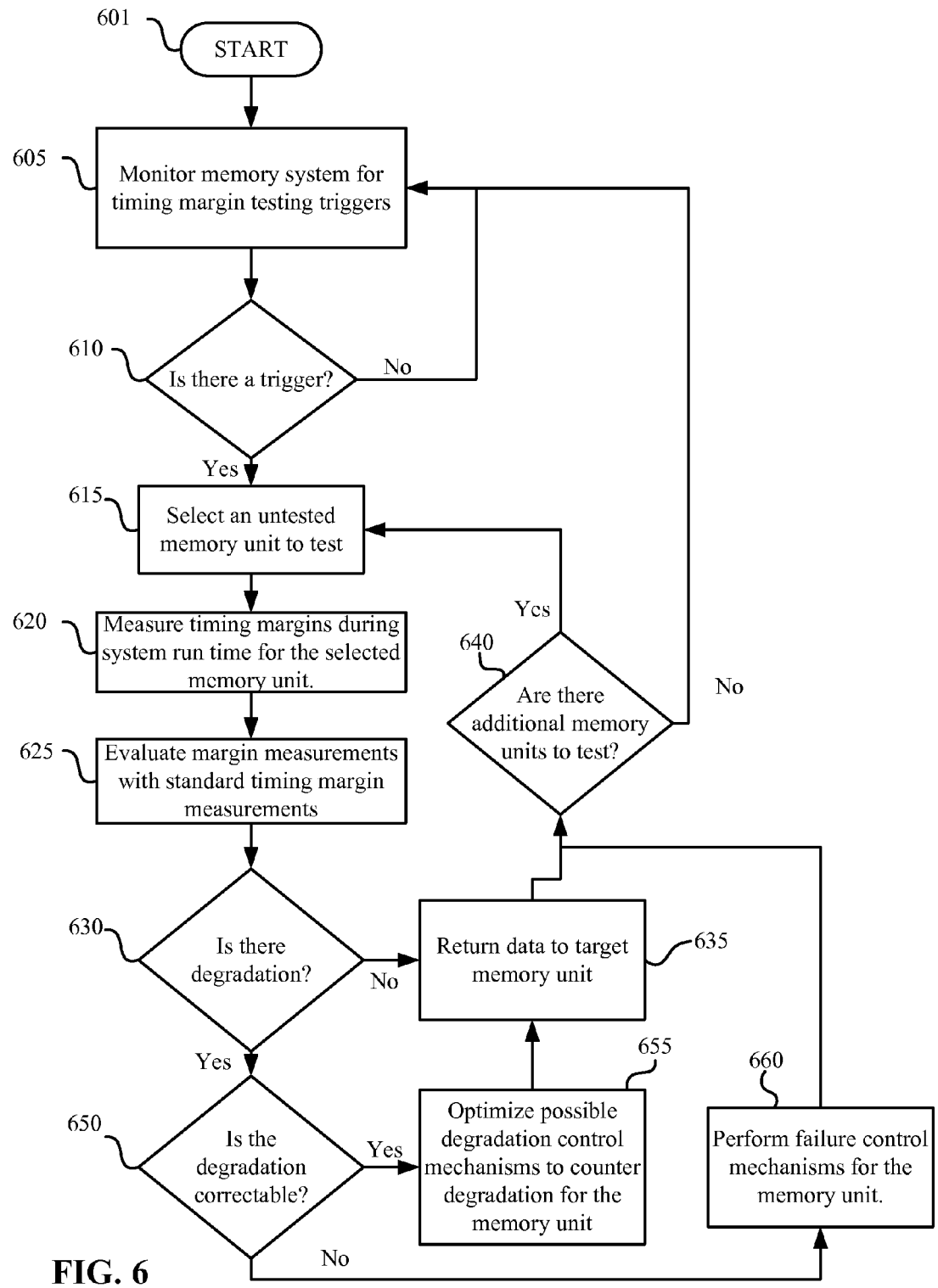
FIG. 6 is a flow chart of a method of measuring timing margin degradation of the memory system and correction of it, according to an embodiment.

FIG. 6 is a flow chart illustrating a method 600 of testing the timing margins for degradation in the memory system 100. The method 600 starts at operation 601. In operation 605, the firmware 194 may monitor the computer system for a trigger to begin timing margin measurements. Triggers that the firmware 194 may monitor may include, but are not limited to, periodical RAS (Reliability, Availability, and Serviceability), user initiated triggers through firmware 194, correctable error syndromes, uncorrectable errors, and calibration driven initiation (after so many calibration runs a timing margin measurement may be initiated). Timing margin measurements may not need to run with every calibration because degradation most likely occurs after extended periods of time. In operation 610, if there is not a trigger, then the firmware 194 may continue monitoring the memory system 100. If there is a trigger, then in the method 600 may continue to operation 615. In operation 615, the firmware 194 may initiate the timing margin measurement and select a standard memory unit 182 to target for measurement.

Figure 7A:
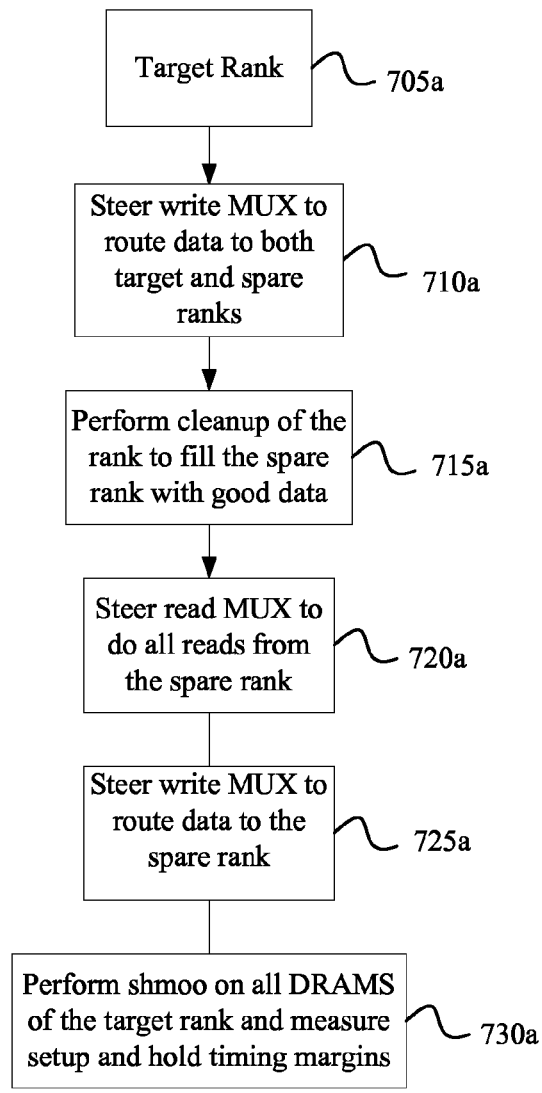
FIG. 7A is a flow chart of one of the operations of FIG. 6 in greater detail, according to an embodiment.
Figure 7B:
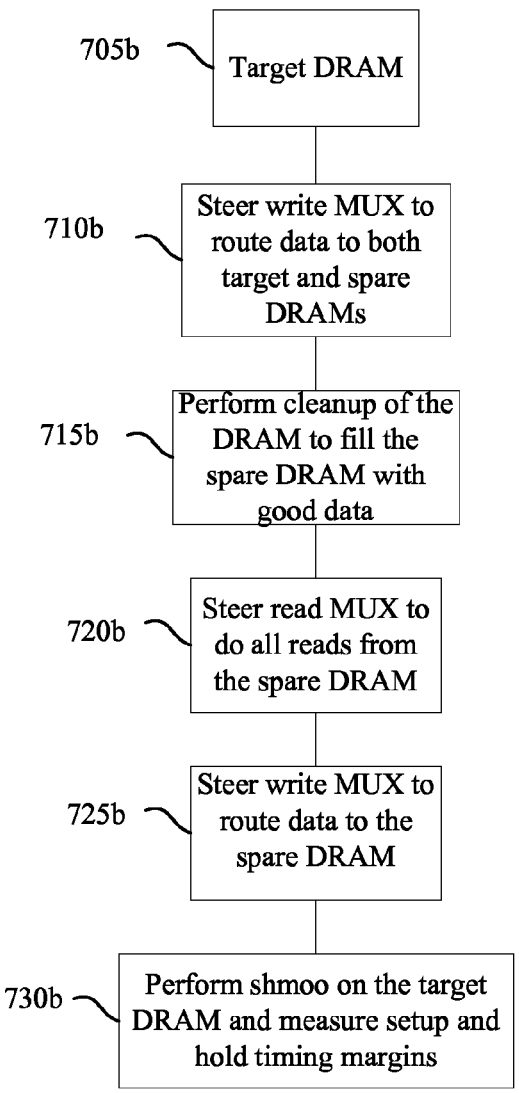
FIG. 7B is a flow chart of one of the operations of FIG. 6 in greater detail, according to an embodiment.

In operation 620, the timing margin measurement may be performed during run time of the system. Below, FIG. 7A and FIG. 7B illustrate the operation 620 of FIG. 6 in greater detail for rank-wise timing margin measurement and byte-wise timing margin measurements, respectively. The data on the memory unit 182 being targeted may be moved to a spare memory unit 184. Moving the data from the target memory unit 182 to the spare memory unit 184 may allow for the continued operation of the memory 110 while the timing margin measurements are taking place.

In operation 625, the firmware 194 may evaluate the timing margin measurements with the timing margin profile measurement. The firmware 194 may determine whether the middle value of the measured timing margin is "too close" to the upper and/or lower delay margins, in operation 630. For example, the firmware 194 may determine whether a difference between the upper delay margin and the middle value is below a threshold value.

When the firmware 194 detects that the difference is above or equal to the threshold in operation 630, then, in operation 635, the user data may be restored to the target memory unit 182. In operation, 640 it may be determined whether there are any more memory units 182 to test. If there are more memory units 182 to test, then the method 600 may return to selecting an untested memory unit 182, in operation 615. If there are no memory units 182 to test, then the method 600 may return to monitoring the memory system 100 and computer system for timing margin measurement triggers in operation 605.

In operation 630, when the firmware 194 detects that the difference of the middle margin and the lower or higher margins is below the threshold (i.e., the middle value is "too close"), then, in operation 650, it may be determined whether the degradation of the timing margins is correctable. If the degraded timing margins are not correctable, then, in operation 660, failure control mechanisms for the memory unit 182 may be performed by the firmware 194. This may include using the spare memory unit 184 in place of the targeted memory unit 182. For example, the spare rank 215 may be used instead of the target rank 215 or the spare DRAM 405 may be used instead of the target DRAM 205. After performing the failure control mechanism, then, in operation 640, the firmware 194 may determine whether there are anymore memory units 182 to test.

If the degradation is correctable in operation 650, then, in operation 655, the firmware 194 may perform actions to optimize possible degradation control mechanisms to counter for the degradation of the memory unit 182. Possible control mechanisms may include adjusting the voltage of the memory system 100, generating a warning regarding the memory unit 182 to the hypervisor 192 warning of possible failure of the memory unit 182 in the near future, revisit and tune gate settings set by calibration protocol, or any combination thereof. For example, the firmware 194 may generate a warning to a hypervisor 192 or to an operating system, or any combination thereof. The warning may indicate that the memory unit 182, the DRAM 205, or rank 220 is at risk of producing an error. In response to the warning, the hypervisor 192 and/or the operating system may move data away from the memory unit 182, rank 220, and the DRAM 205. Once the degradation is optimized, then operation 635 may be performed by returning user data to the target memory unit 182 as described in FIGS. 8A and 8B.

In an embodiment, of the rank-wise timing measurement example, if the spare rank 215 is used due to a target rank 220 having an uncorrectable timing margin, then the method 600 may end because there is no longer a spare rank 215 available to perform the timing margin measurement.

FIG. 7A and FIG. 7B illustrate the operation 620 of FIG. 6 in greater detail for rank-wise timing margin measurement and byte-wise timing margin measurements, respectively, according to an embodiment. In an exemplary embodiment, FIG. 7A is a flow diagram of a rank-wise timing margin measurement corresponding with the architectures of FIG. 2 and FIG. 3. In operation 705a, the selected memory unit 182, which may be a selected rank 220, may be targeted by the firmware 194. In operation 710a, the firmware 194 may steer a write MUX of the RW MUX logic 175 to route data to both the target rank 220 and the spare rank 215 or spare memory unit 184. In operation 715a, the firmware 194 may direct the scrub engine 160 to perform a cleanup of the target rank 220 by performing a read-modify-write of the target rank 220 to fill the spare rank 215 with good data.

In operation 720a, the firmware 194 may steer a read MUX of the RW MUX logic 175 to the spare rank 215 so the memory system 100 may read the data from the spare rank 215 instead of the target rank 220. In operation 725a, likewise, the firmware 194 may steer the write MUX of the RW MUX logic 175 to route data to the spare rank 215 instead of the target rank 220 while the target rank 220 is being tested.

Similarly, in an exemplary embodiment, FIG. 7B is a flow diagram of a byte-wise timing margin measurement corresponding with the architecture illustrated in FIG. 4 and FIG. 5. In operation 705b, the selected memory unit 182, which may be a selected DRAM 205, may be targeted by the firmware 194. In operation 710b, the firmware 194 may steer a write MUX of the RW MUX logic 175 to route data to both the target DRAM 205 and the spare DRAM 405 or spare memory unit 184. In operation 715b, the firmware 194 may direct the scrub engine 160 to perform a cleanup of the target DRAM 205 by performing a read-modify-write of the target DRAM 205 to fill the spare DRAM 405 with good user data.

In operation 720b, the firmware 194 may steer a read MUX of the RW MUX logic 175 to the spare DRAM 405 so the memory system 100 may read the data from the spare DRAM 405 instead of the target DRAM 205. In operation 725a, likewise, the firmware 194 may steer the write MUX to route data to the spare DRAM 405 instead of the target DRAM 205 while the target DRAM 205 is being tested.

In operation 730a and 730b of FIG. 7A and FIG. 7B respectively, the firmware 194 may perform a shmoo of the DRAM of the target rank 220 or target DRAM 205 to determine the degradation of the timing margins. That is, the firmware 194 may update the delay register setting 170 for the target rank 220 or target DRAM 205 based on a determined upper delay margin of the timing margins and a determined lower delay margin of the timing margins and/or detect that a difference between the upper delay margin and the lower delay margin is below a threshold. For example, the firmware 194 may direct the self-test engine 165 to determine an upper delay margin and a lower delay margin. The delay setting 170 may have an initial value. The self-test engine 165 may determine an upper delay margin by incrementing the delay register setting 170 by an increment value and determining whether the fault is detected. The self-test engine 165 may repeatedly increment the delay setting 170 and perform the determination until a fault is detected. The upper delay margin may thus represent an upper boundary of the delay setting 170 at which a fault is detected. Similarly, the self-test engine 165 may determine a lower delay margin by decrementing the delay setting 170 by a decrement value and determining whether a fault is detected. The self-test engine 165 may repeatedly decrement the delay setting 170 until a fault is detected. The lower delay margin may thus represent a lower boundary of the delay setting 170 at which a fault is detected. The self-test engine 165 may reset the delay setting 170 to the initial value after determining the upper delay margin and before determining the lower delay margin, or vice versa. The self-test engine 165 may determine the lower delay margin before determining the upper delay margin, or vice versa. The firmware 194 may calculate a middle value that is between the lower delay margin and the upper delay margin (e.g., approximately half of a difference between the upper delay margin and the lower delay margin) and update the delay setting 170 to be the middle value.

Figure 8A:
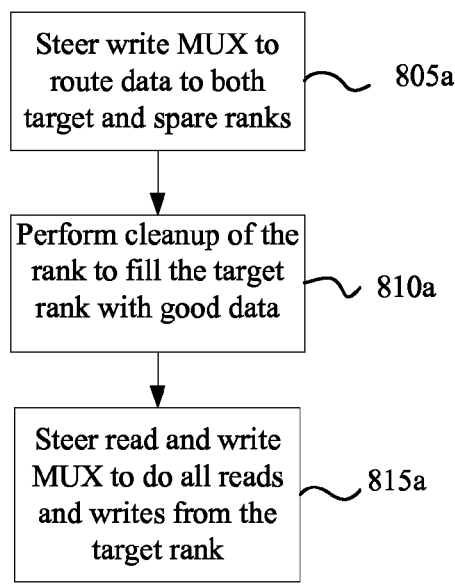
FIG. 8A is a flow chart of one of the operations of FIG. 6 in greater detail, according to an embodiment.
Figure 8B:
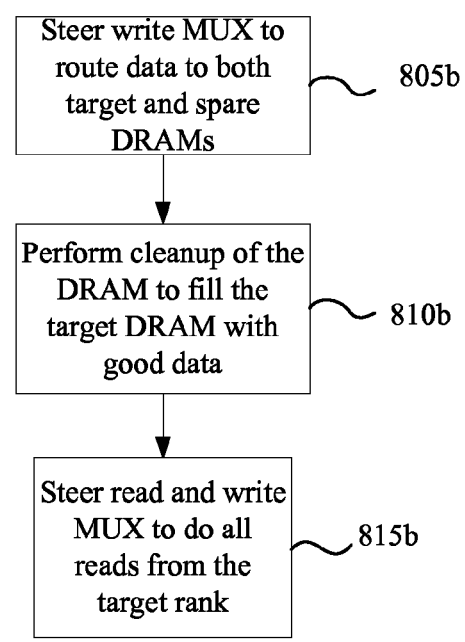
FIG. 8B is a flow chart of one of the operations of FIG. 6 in greater detail, according to an embodiment.

Referring to FIG. 8A for rank-wise measurement testing and FIG. 8B for byte-wise memory testing, operation 635, for restoring data from the spare memory unit 184 to the target memory unit, is illustrated. Referring to FIG. 8A, in operation 805a, for a rank wise time margin measurement, the firmware 194 may steer the write MUX back to route data to both the target rank 220 and spare ranks 215. In operation 810a, the firmware 194 may direct the scrub engine 160 to perform read-modify-write of the target rank 220 to restore the user data to the DRAM 205 of the target rank 220. The user data that is restored to the target rank 220 may have been updated by a write access during the memory testing and/or corrected by an ECC decoder. In operation 815a, the firmware 194 may steer the read MUX to do all reads from the target rank 220 and turn off the spare rank 215.

Referring to FIG. 8B, in operation 805b, for a byte-wise time margin measurement, the firmware 194 may steer the write MUX back to route data to both the target DRAM 205 and spare DRAM 405. In operation 810b, the firmware 194 may direct the scrub engine 160 to perform read-modify-write of the target DRAM 205 to restore the user data to the target DRAM 205. The user data that is restored to the target DRAM 205 may have been updated by a write access during the memory testing and/or corrected by an ECC decoder. In operation 815b, the firmware 194 may steer the read MUX to do all reads from the target DRAM 205 and turn off the spare DRAM 405.

While embodiments have been described with reference to the details of the embodiments shown in the drawings, these details are not intended to limit the scope of the invention as claimed in the appended claims.

What is claimed is:

1. A method for testing and correcting a memory system comprising:
    selecting a target memory unit of the memory system in response to a trigger to start a timing margin measurement;
    moving data stored in the target memory unit to a spare memory unit;
    steering reads from and writes of data to the spare memory unit instead of the target memory while performing two or more timing measurements of the target memory unit, wherein the two or more timing measurements of the target memory unit include a measurement of a setup margin and a measurement of a hold margin; and
    determining whether a timing measurement has degraded beyond a threshold value by comparing the timing margin measurements of the target memory unit with a timing margin profile measurement.

2. The method of claim 1, further comprising, in response to determining that the timing measurement has not degraded beyond the threshold value:
    moving data stored in the spare memory unit to the target memory unit; and
    performing reads from and writes of data to the target memory unit.

3. The method of claim 1, further comprising, in response to determining that the timing measurement has degraded beyond the threshold value:
    adjusting a voltage of the memory system when the degradation is correctable;
    moving data stored in the spare memory unit to the target memory unit; and
    performing reads from and writes of data to the target memory unit.

4. The method of claim 1, further comprising, in response to determining that the timing measurement has degraded beyond the threshold value:
    using the spare memory unit in place of the target memory unit when the timing margin degradation is uncorrectable.

5. The method of claim 1, further comprising, in response to determining that the timing measurement has degraded beyond the threshold value:
    adjusting a delay register setting of the memory system when the degradation is correctable;
    moving data stored in the spare memory unit to the target memory unit; and
    performing reads from and writes of data to the target memory unit.

6. The method of claim 1, further comprising, in response to determining that the timing measurement has degraded beyond the threshold value:
    generating a warning regarding the target memory unit when the degradation is correctable.

7. The method of claim 1, wherein the target memory unit and the spare memory unit are a target rank and a spare rank respectively.

8. The method of claim 1, wherein the target memory unit and the spare memory unit are a target dynamic random access memory (DRAM) and a spare DRAM respectively.

9. The method of claim 1, wherein the trigger to start a timing margin measurement is a detection of an error by an error correction code module.

10. The method of claim 1, wherein the trigger to start a timing margin measurement is a user initiated trigger.

11. The method of claim 1, wherein the trigger to start a timing margin measurement is a periodic trigger initiated after a particular number of calibration operations.

12. The method of claim 1, wherein the target memory unit is a double data rate dynamic random access memory (DRAM) and the spare memory unit is a double data rate DRAM respectively.

13. A system comprising:
a volatile memory;
firmware configured to select a target memory unit of the memory system in response to a trigger to start a timing margin measurement; and
a memory buffer configured to:
move data stored in the target memory unit to a spare memory unit;
steer reads from and writes of data to the spare memory unit instead of the target memory while performing two or more timing measurements of the target memory unit, wherein the two or more timing measurements of the target memory unit include a measurement of a setup margin and a measurement of a hold margin; and
wherein the firmware further is configured to determine whether a timing measurement has degraded beyond a threshold value by comparing the timing margin measurements of the target memory unit with a timing margin profile measurement.

14. The system of claim 13, wherein the memory buffer is further configured to:
move data stored in the spare memory unit to the target memory unit when the timing measurement has not degraded beyond the threshold value, and
adjust the memory system to perform reads and writes of user data from the target memory unit.

15. The system of claim 13, wherein the firmware is further configured to:
adjust a voltage of the memory system when a timing measurement has degraded beyond a threshold value and the degradation is correctable.

16. The system of claim 13, wherein the firmware is further configured to, in response to determining that the timing measurement has degraded beyond the threshold value:
adjust a delay register setting of the memory system when the degradation is correctable.

17. The system of claim 16, wherein the target memory unit and the spare memory unit are a target rank and a spare rank respectively.

18. The system of claim 16, wherein the target memory unit and the spare memory unit are a target dynamic random access memory (DRAM) and a spare DRAM respectively.

19. The system of claim 13 wherein the firmware is further configured to, in response to determining that the timing measurement has degraded beyond the threshold value, generate a warning regarding the target memory unit.

20. The system of claim 13 wherein the trigger to start a timing margin measurement is a detection of an error by an error correction code module.

* * * * *